(12) United States Patent
Yang et al.

(10) Patent No.: US 9,793,279 B2
(45) Date of Patent: Oct. 17, 2017

(54) SPLIT GATE NON-VOLATILE MEMORY CELL HAVING A FLOATING GATE, WORD LINE, ERASE GATE, AND METHOD OF MANUFACTURING

(71) Applicant: Silicon Storage Technology, Inc., San Jose, CA (US)

(72) Inventors: Jeng-Wei Yang, Zhubei (TW); Man-Tang Wu, Hsinchu County (TW); Chun-Ming Chen, New Taipei (TW); Mandana Tadayoni, Cupertino, CA (US); Chien-Sheng Su, Saratoga, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/182,527

(22) Filed: Jun. 14, 2016

(65) Prior Publication Data
US 2017/0012049 A1    Jan. 12, 2017

Related U.S. Application Data

(60) Provisional application No. 62/191,047, filed on Jul. 10, 2015.

(51) Int. Cl.
*H01L 27/115* (2017.01)
*H01L 27/11524* (2017.01)
(Continued)

(52) U.S. Cl.
CPC ........ *H01L 27/11524* (2013.01); *G11C 16/26* (2013.01); *H01L 21/28273* (2013.01);
(Continued)

(58) Field of Classification Search
CPC .......... H01L 27/11524; H01L 29/7881; H01L 29/7883; H01L 29/42328; H01L 21/28273;
(Continued)

(56) References Cited

U.S. PATENT DOCUMENTS 5,029,130 A    7/1991  Yeh
6,747,310 B2   6/2004  Fan et al.
(Continued)

FOREIGN PATENT DOCUMENTS

TW    201511238 A    3/2015

*Primary Examiner* — J. H. Hur
*Assistant Examiner* — Ajay Ojha
(74) *Attorney, Agent, or Firm* — DLA Piper LLP (US)

(57) ABSTRACT

A memory device including a silicon semiconductor substrate, spaced apart source and drain regions formed in the substrate with a channel region there between, and a conductive floating gate disposed over a first portion of the channel region and a first portion of the source region. An erase gate includes a first portion that is laterally adjacent to the floating gate and over the source region, and a second portion that extends up and over the floating gate. A conductive word line gate is disposed over a second portion of the channel region. The word line gate is disposed laterally adjacent to the floating gate and includes no portion disposed over the floating gate. The thickness of insulation separating the word line gate from the second portion of the channel region is less than that of insulation separating the floating gate from the erase gate.

5 Claims, 15 Drawing Sheets

(51) Int. Cl.
*H01L 29/423* (2006.01)
*H01L 21/28* (2006.01)
*H01L 29/788* (2006.01)
*H01L 29/66* (2006.01)
*G11C 16/26* (2006.01)
*H01L 27/11521* (2017.01)

(52) U.S. Cl.
CPC .. *H01L 29/42328* (2013.01); *H01L 29/66825* (2013.01); *H01L 29/7881* (2013.01); *H01L 29/7883* (2013.01); *H01L 27/11521* (2013.01)

(58) Field of Classification Search
CPC ......... H01L 29/66825; H01L 27/11521; G11C 16/26
See application file for complete search history.

(56) References Cited

U.S. PATENT DOCUMENTS

| | | | |
|---|---|---|---|
| 7,868,375 B2 | 1/2011 | Liu et al. | |
| 8,513,728 B2* | 8/2013 | Ghazavi | H01L 27/0207 257/316 |
| 8,669,607 B1* | 3/2014 | Tsair | H01L 29/7881 257/316 |
| 8,711,636 B2 | 4/2014 | Do et al. | |
| 9,257,571 B1* | 2/2016 | Tseng | H01L 29/792 |
| 9,356,032 B2* | 5/2016 | Mizushima | H01L 27/11521 |
| 2015/0348786 A1* | 12/2015 | Loiko | H01L 21/28008 257/316 |

* cited by examiner

Cell Operation
Example #1

| | Word-line (WL) | | Bit-line (BL) | | Erase Gate (EG) | | Source-line (Vss) | | Time |
|---|---|---|---|---|---|---|---|---|---|
| | Sel. | Uns. | Sel. | Uns. | Sel. | Uns. | Sel. | Uns. | |
| Read | 2.5V~1.05 (Vgr) | 0V | 0.8V (Vdr) | 0V | 2.5V~1.05 | 0V | 0V | 0V | |
| Erase | 0V | 0V | 0V | 0V | 11.5V | 0V | 0V | 0V | 10ms (Ters) |
| Program | Vwl>Vtwl but <Vcc (Vgp) | 0V | 1-2.5µA (Idp) | Vdd (Vinh) | 7V | 0V | 7V | 0V | 10µs (Tpgm) |

FIGURE 6

Cell Operation Example #2

| | Word-line (WL) | | Bit-line (BL) | | Erase Gate (EG) | | Source-line (Vss) | | Time |
|---|---|---|---|---|---|---|---|---|---|
| | Sel. | Uns. | Sel. | Uns. | Sel. | Uns. | Sel. | Uns. | |
| Read | 2.5V~1.05 (Vgr) | 0V | 0.8V (Vdr) | 0V | 0V | 0V | 0V | 0V | |
| Erase | 0V | 0V | 0V | 0V | 11.5~12V | 0V | 0V | 0V | 8ms (Ters) |
| Program | 1V~0.7V (Vgp) | 0V | 5µA (Idp) | Vdd (Vinh) | 5V | 0V | 8.5~9V | 0V | 0.2µs (Tpgm) |

Vgr and Vgp depend on technology node.

FIGURE 7

Cell Operation
Example #3

| | Word-line (WL) | | Bit-line (BL) | | Erase gate (EG) | | Source-line (Vss) | | Time |
|---|---|---|---|---|---|---|---|---|---|
| | Sel. | Uns. | Sel. | Uns. | Sel. | Uns. | Sel. | Uns. | |
| Read | 2.5V~1.05 (Vgr) | 0V | 0.8V (Vdr) | 0V | 0V | 0V | 0V | 0V | |
| Erase | 0V | 0V | 0V | 0V | 8V | 0V | -8V | 0V | 8ms (Ters) |
| Program | 1V~0.7V (Vgp) | 0V | 5µA (Idp) | Vdd (Vinh) | 5V | 0V | 8.5~9V | 0V | 0.2µs (Tpgm) |

Vgr and Vgp depend on technology node.

FIGURE 8

SPLIT GATE NON-VOLATILE MEMORY CELL HAVING A FLOATING GATE, WORD LINE, ERASE GATE, AND METHOD OF MANUFACTURING

RELATED APPLICATIONS

This application claims the benefit of U.S. Provisional Application No. 62/191,047, filed Jul. 10, 2015, and which is incorporated herein by reference.

FIELD OF THE INVENTION

The present invention relates to split gate flash memory cell design and operation.

BACKGROUND OF THE INVENTION

Split gate non-volatile flash memory devices are known. FIG. 1 illustrates a 2-Gate Cell that includes two gates (word line gate WL and floating gate FG), and thus includes three terminals (word line WL, source S, and drain D). Drain D can alternately be referred to as bit line BL, and word line WL can alternately be referred to as the control gate. The floating gate FG is partially over and insulated from the source S and a portion of the channel region CR (which extends between the source S and drain D), and the word line WL is over and insulated from the other portion of the channel region CR. The floating gate FG has an upper surface terminating in a sharp edge that faces the word line WL (to facilitate erase operation). U.S. Pat. No. 5,029,130 discloses such a memory cell, which is incorporated herein by reference for all purposes.

FIG. 2 illustrates an extended source 2-Gate Cell, which is similar to the memory device of FIG. 1, except that it further includes an extended source line ESL formed over and in contact with source S. The extended source line ESL provides enhanced voltage coupling from the source S to the floating gate FG via the extended source line ESL.

FIG. 3 illustrates a 4-Gate, 5-terminal Cell, which is similar to the memory device of FIG. 1, except that it further includes an erase gate EG over and insulated from source region S, and a coupling gate CG over and insulated from the floating gate FG. The erase operation uses the upper surface edge of the floating gate FG that faces the erase gate EG. Thus, this memory cell has four gates (WL, CG, FG, EG) and 5 terminals (S, D, WL, CG, EG). U.S. Pat. Nos. 6,747,310 and 7,868,375 disclose such a memory cell, which are incorporated herein by reference for all purposes.

It is desirable to achieve the functionality and performance advantages of the 4-gate device, but with smaller device geometries and fewer masking steps during manufacturing.

BRIEF SUMMARY OF THE INVENTION

The aforementioned needs are addressed by a memory device that includes a silicon semiconductor substrate, spaced apart source and drain regions formed in the silicon semiconductor substrate with a channel region there between, a conductive floating gate disposed over and insulated from a first portion of the channel region and a first portion of the source region, and a conductive erase gate. The erase gate includes a first portion that is laterally adjacent to and insulated from the floating gate, and is over and insulated from the source region, and a second portion that extends up and over, and is insulated from, the floating gate. A conductive word line gate is disposed over and insulated from a second portion of the channel region. The word line gate is disposed laterally adjacent to the floating gate and includes no portion disposed over the floating gate. A thickness of insulation separating the word line gate from the second portion of the channel region is less than a thickness of insulation separating the floating gate from the erase gate.

A method of reading a memory cell that includes spaced apart source and drain regions formed in a silicon semiconductor substrate with a channel region there between, a floating gate disposed over and insulated from a first portion of the channel region and partially over the source region, an erase gate disposed over and insulated from the source region, and a word line gate disposed over and insulated from a second portion of the channel region, wherein the erase gate includes a first portion laterally adjacent to the floating gate and a second portion that extends up and over the floating gate, and wherein the word line gate is disposed laterally adjacent to the floating gate and includes no portion disposed over the floating gate. The method includes applying a positive voltage to the word line gate, applying a positive voltage to the drain region, applying a zero voltage to the erase gate, and applying a zero voltage to the source region.

Other objects and features of the present invention will become apparent by a review of the specification, claims and appended figures.

BRIEF DESCRIPTION OF THE DRAWINGS

FIG. 6 is a table showing the operational voltages of the memory cell in a first example.

FIG. 7 is a table showing the operational voltages of the memory cell in a second example.

FIG. 8 is a table showing the operational voltages of the memory cell in a third example.

DETAILED DESCRIPTION OF THE INVENTION

Figure 1:
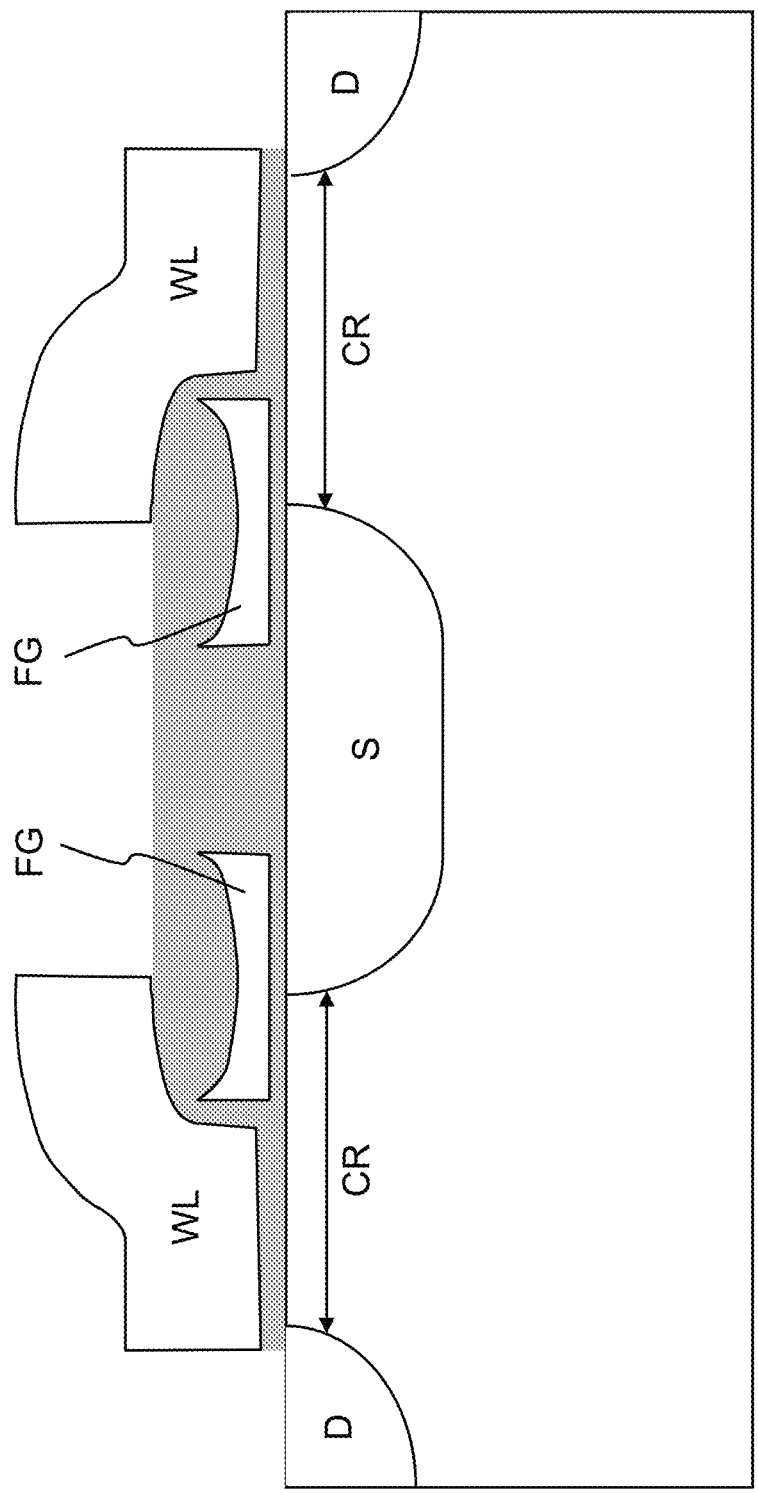
FIG. 1 is a side cross sectional view of a conventional two gate, three terminal non-volatile memory device.
Figure 2:
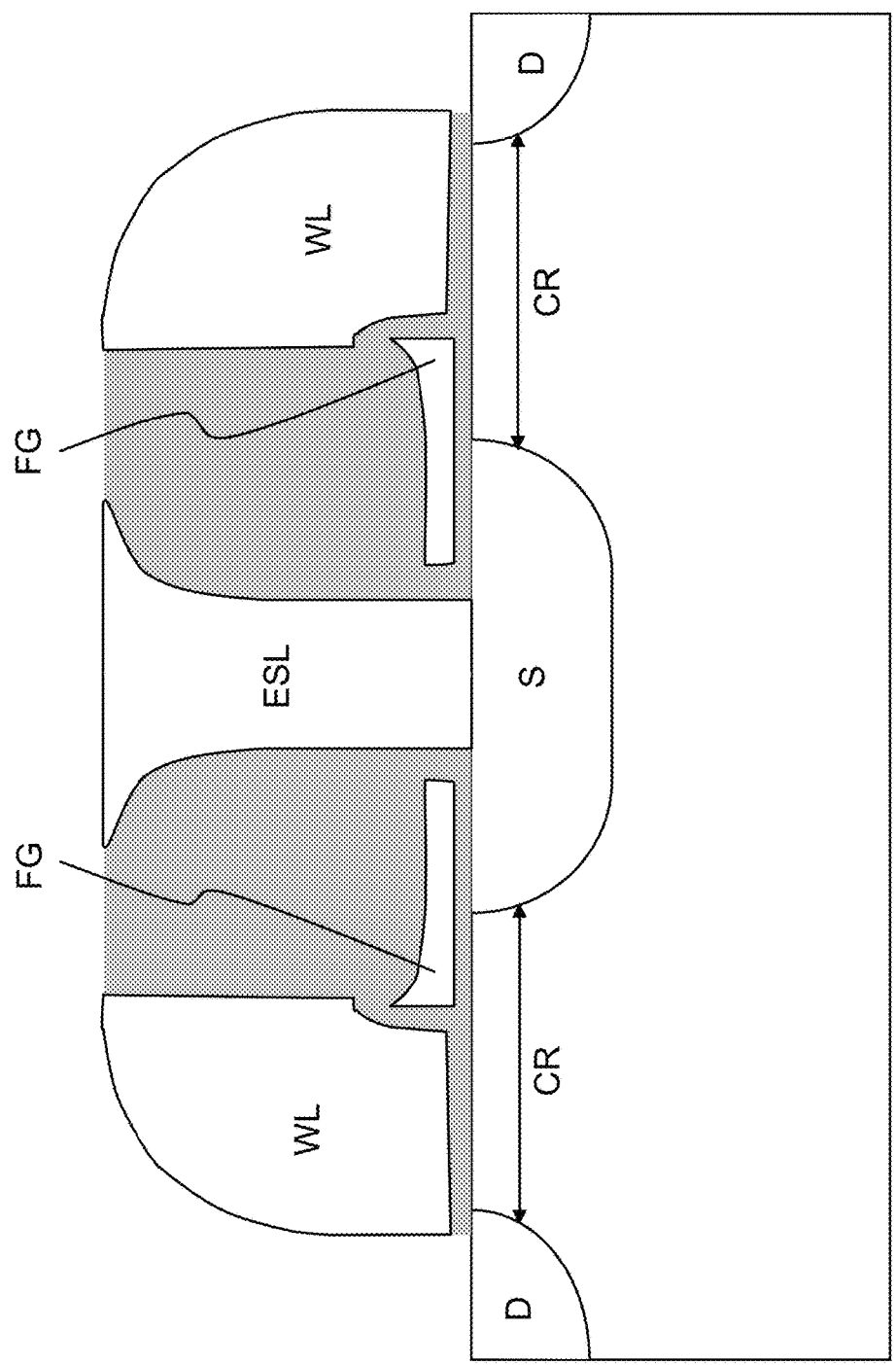
FIG. 2 is a side cross sectional view of a conventional two gate, three terminal non-volatile memory device with an extended source line.
Figure 3:
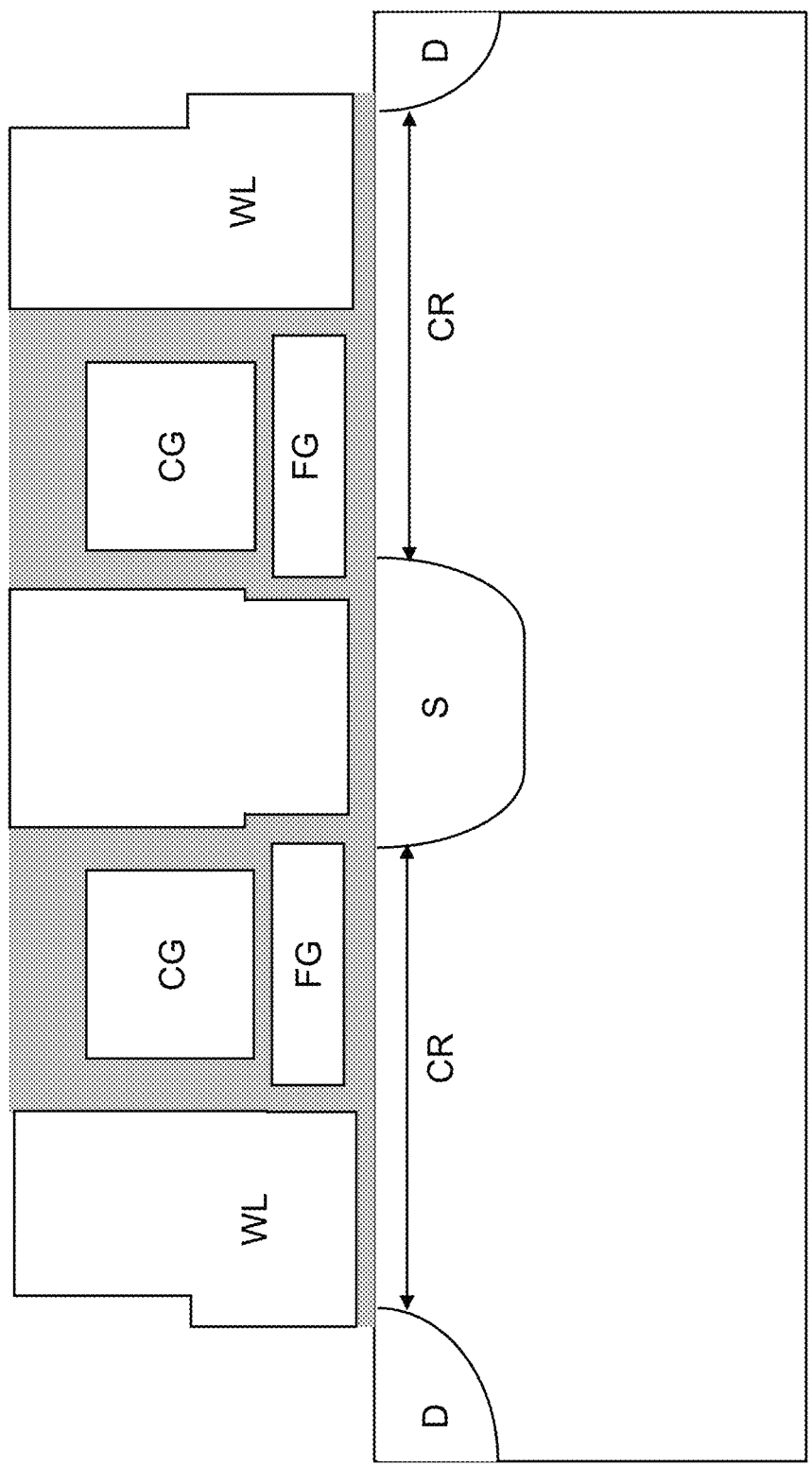
FIG. 3 is a side cross sectional view of a conventional four gate, five terminal non-volatile memory device.
Figure 4:
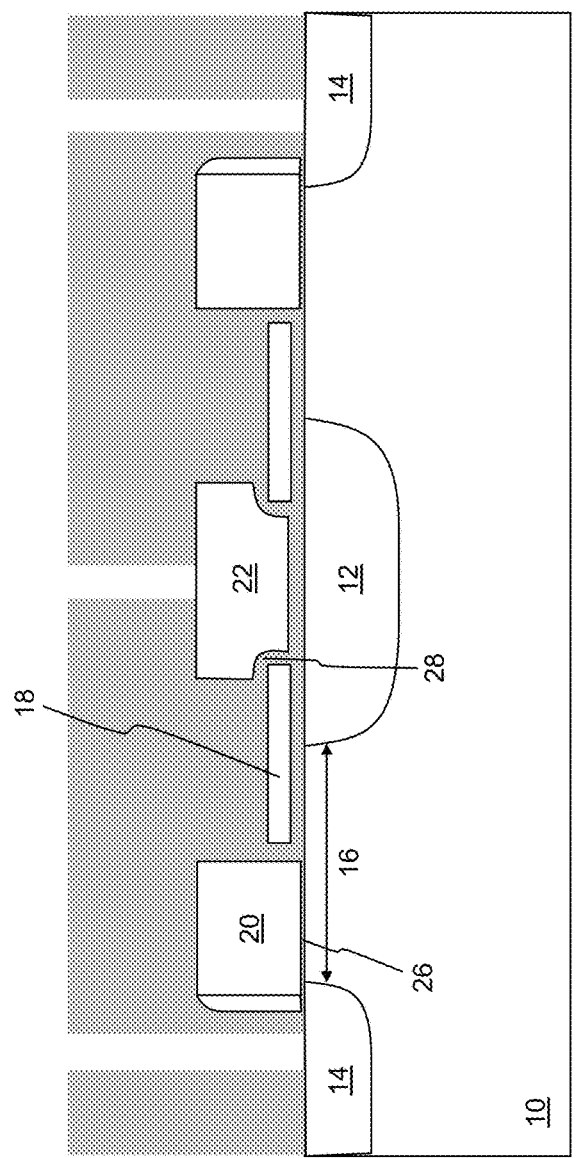
FIG. 4 is a side cross sectional view of a three gate, four terminal non-volatile memory device.
Figure 5:
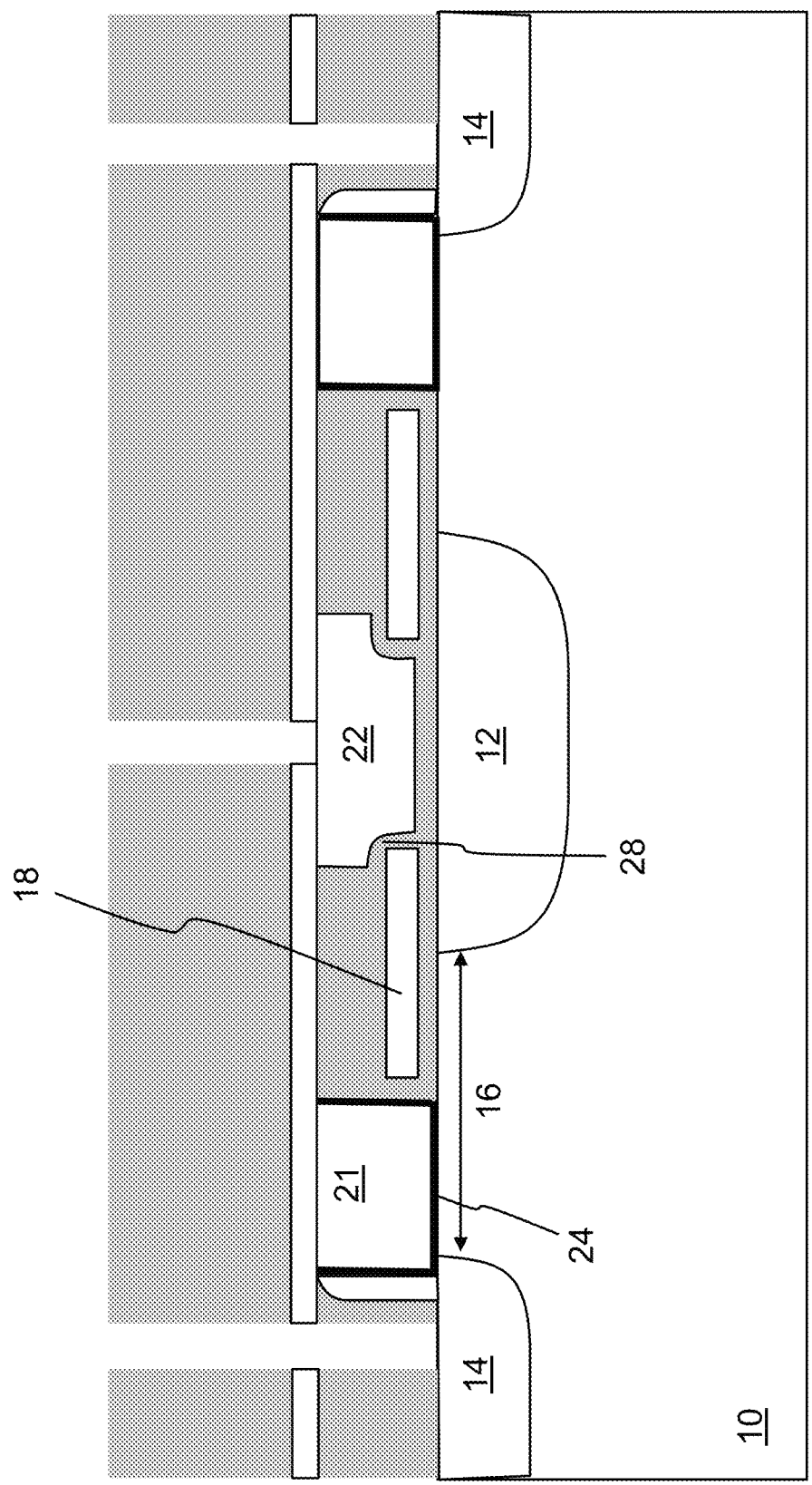
FIG. 5 is a side cross sectional view of a three gate, four terminal non-volatile memory device with metal word line gates and high K dielectric.

The present invention is a 3-gate, 4-terminal non-volatile memory cell device, as shown in FIGS. 4 and 5, the method of making such memory cell devices, and the method of operating such memory devices. As shown in FIG. 4, source region 12 and drain region 14 are formed in a silicon substrate 10, with a channel region 16 of the substrate therebetween. A floating gate 18 is preferably polysilicon and is formed over and insulated from the source region 12 and a first portion of the channel region 16. A word line gate 20 can be polysilicon and is formed over and insulated from a second portion of the channel region 16. An erase gate 22 is preferably polysilicon and is formed over and insulated from the source region 12. The erase gate 22 has a first portion laterally adjacent the floating gate 18, and a second portion that extends up and over the floating gate 18. Unlike the four gate device described above, the memory cell in FIG. 4 does not have a coupling gate. The memory cell device of FIG. 5 is the same as that of FIG. 4, except the polysilicon word line gates 20 are replaced with metal gates 21, and are surrounded by a high K dielectric 24 (i.e. having a dielectric constant K greater than that of oxide, such as HfO2, ZrO2, TiO2, Ta2O5, or other adequate materials, etc.).

The three-gate memory cell configurations of FIGS. 4 and 5 have many advantages. Specifically, they utilize capacitive coupling between the erase gate 22 and floating gate 18 during programming, so that a separate coupling gate is not needed. The length of the word line gate 20, and the thickness of the oxide layer 26 between the word line gate 20 and the substrate 10, can be shrunk while maintaining high cell current and speed. The tunneling oxide layer 28 between the floating gate 18 and erase gate 22 is protected by the erase gate 22 (which wraps around the tunnel oxide), to prevent degradation during subsequent chip processing to ensure good erase capability and endurance. The total cell height, as well as erase gate and word line gate height, can be adjusted to meet the height of logic gates formed on the same chip. The width and length of the floating gate 18, and the source line 12, can be formed by a self-aligned process. Process, strap layout and layout of metal connections will be simpler since the coupling gate is eliminated. Metal connections will be easier to fill in small Y-pitch in advance technology such as 40 nm, 28 and 20 nm technology nodes.

FIG. 6 illustrates cell operation voltages for selected and unselected lines of an array of the 3-gate memory cell of the present invention, according to a first example. Selected lines (Sel.) include the memory cell(s) being operated on, and unselected lines (Uns.) are those that do not include the memory cell(s) being operated on.

FIG. 7 illustrates cell operation voltages for selected and unselected lines of an array of the 3-gate memory cell of the present invention, according to a second example. In this example, a positive voltage on the erase gate is used for the erase operation.

FIG. 8 illustrates cell operation voltages for selected and unselected lines of an array of the 3-gate memory cell of the present invention, according to a third example. In this example, a negative voltage on the source line is used for the erase operation.

Figure 9A:
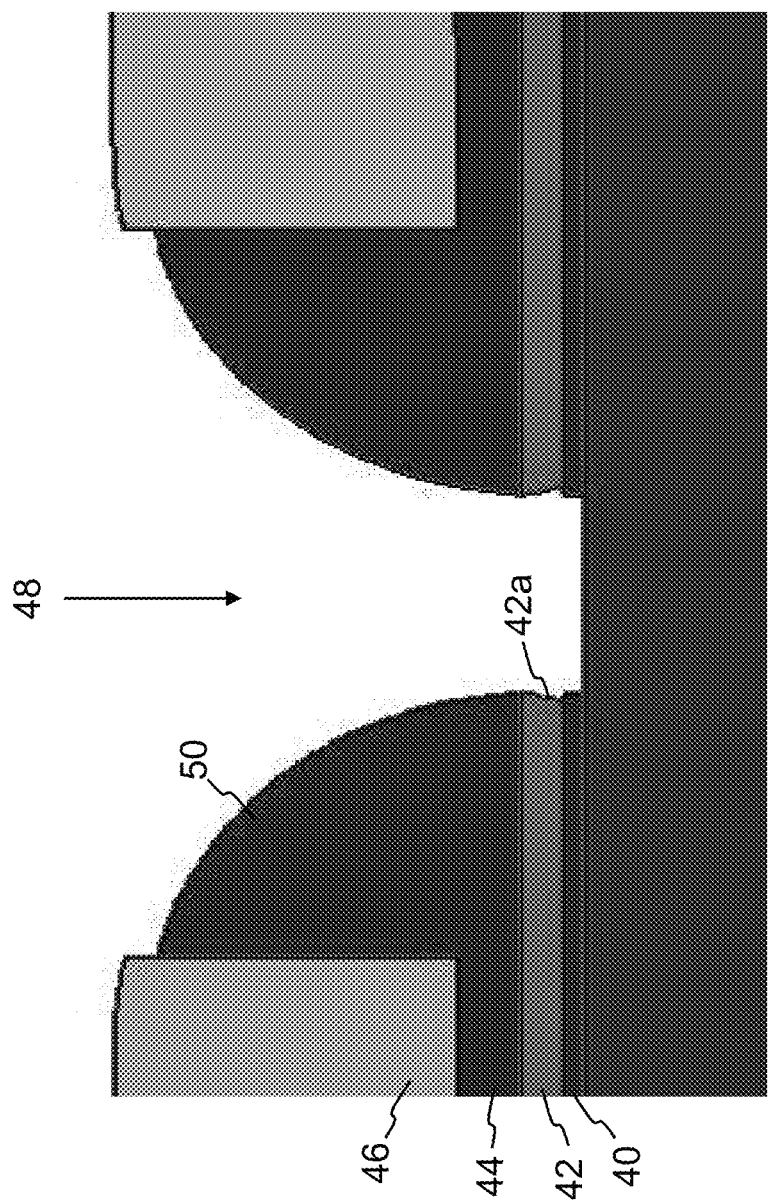
FIGS. 9A-9F are side cross sectional views illustrating the steps in forming the non-volatile memory cell.

FIGS. 9A-9F illustrate the steps in forming the 3-gate memory device. After forming STI isolation regions between the active regions, the following layers are formed: silicon dioxide (oxide) 40 on the substrate 10, polysilicon (poly) 42 on oxide 40, oxide 44 on poly 42, and silicon nitride (nitride) 46 on oxide 44. The nitride 46 is patterned (e.g. photolithography masking process) with a trench 48. Oxide spacers 50 are formed inside the trench 48 and over the poly layer 42. The exposed portion of poly layer 42 between the spacers 50 is removed by poly etch, exposing oxide layer 40. The exposed portion of oxide layer 40 is removed by oxide etch. The resulting structure is shown in FIG. 9A. Preferably, the etched sidewalls of poly layer 42 will be inwardly slanted (see slanted portion 42a), to create sharper upper edges to the poly layer 42.

Figure 9B:
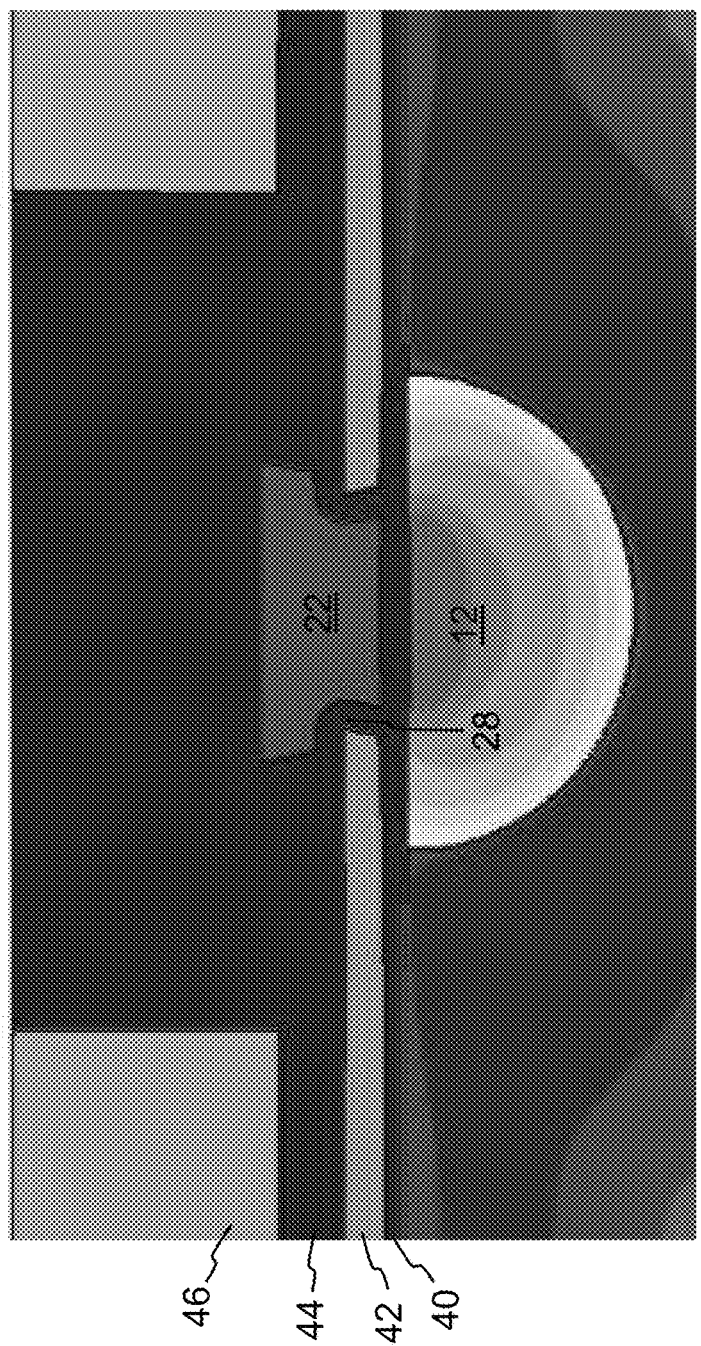

An implantation is performed to form source region 12 in the substrate underneath trench 48. Oxide etch and formation are performed to form a tunnel oxide 28 that extends along and over the top of slanted portions 42a (i.e. on the exposed end portions of poly 42). A poly deposition and etch are used to form polysilicon in the bottom of trench 48, which constitutes erase gate 22. An oxide and etch back are used to fill the trench 48 with oxide (over erase gate 22). The resulting structure is shown in FIG. 9B.

Figure 9C:
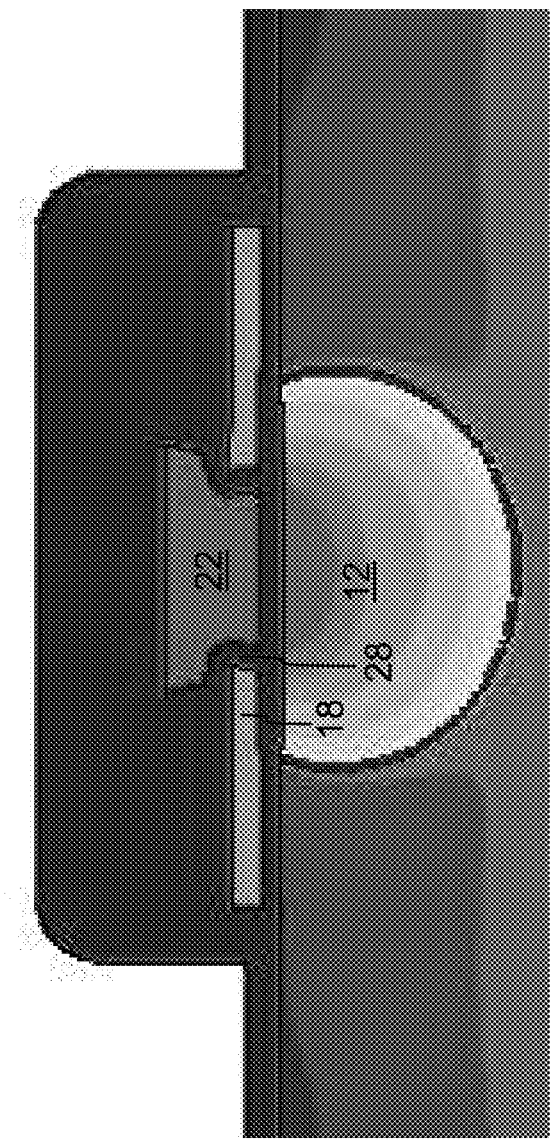
Figure 9D:
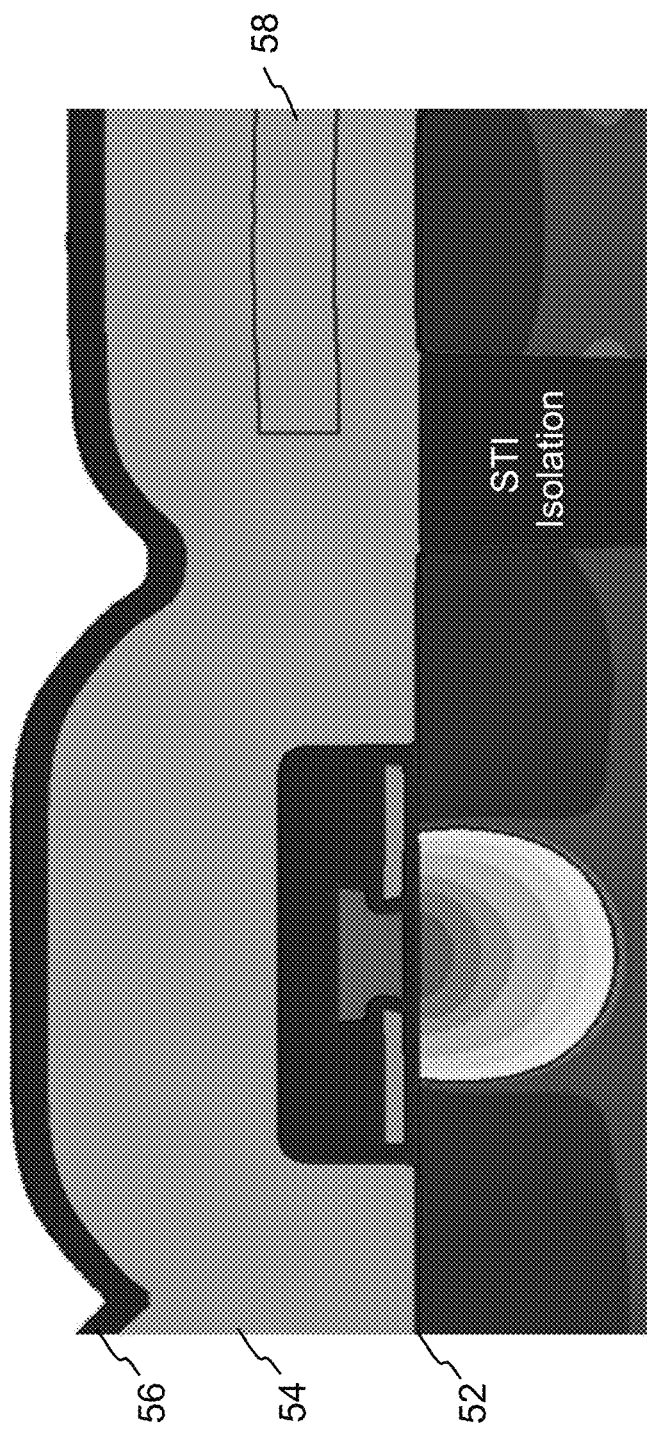
Figure 9E:
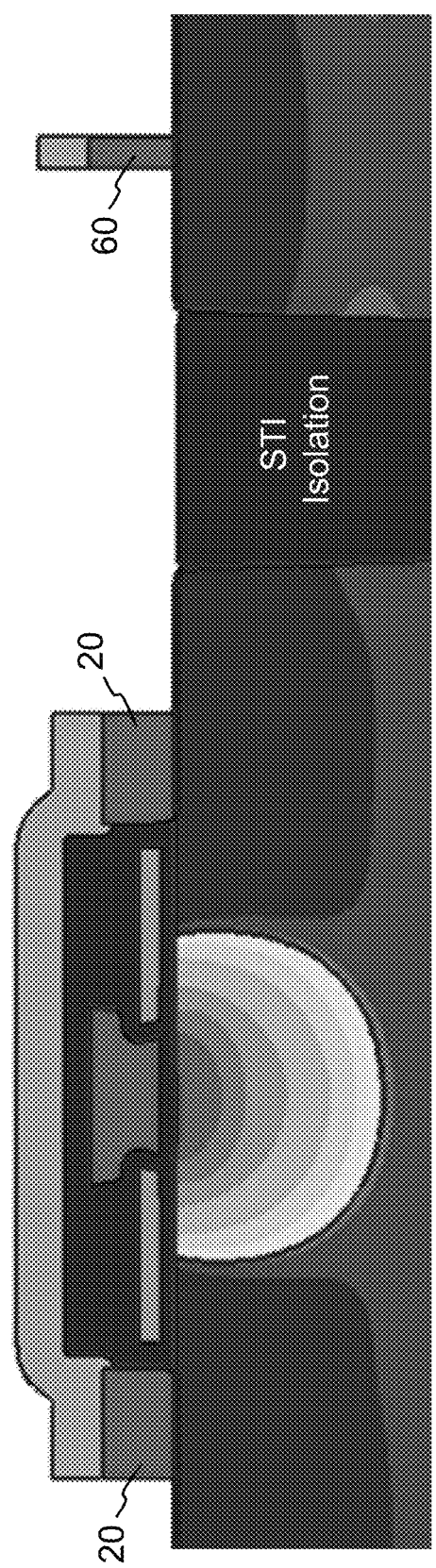
Figure 9F:
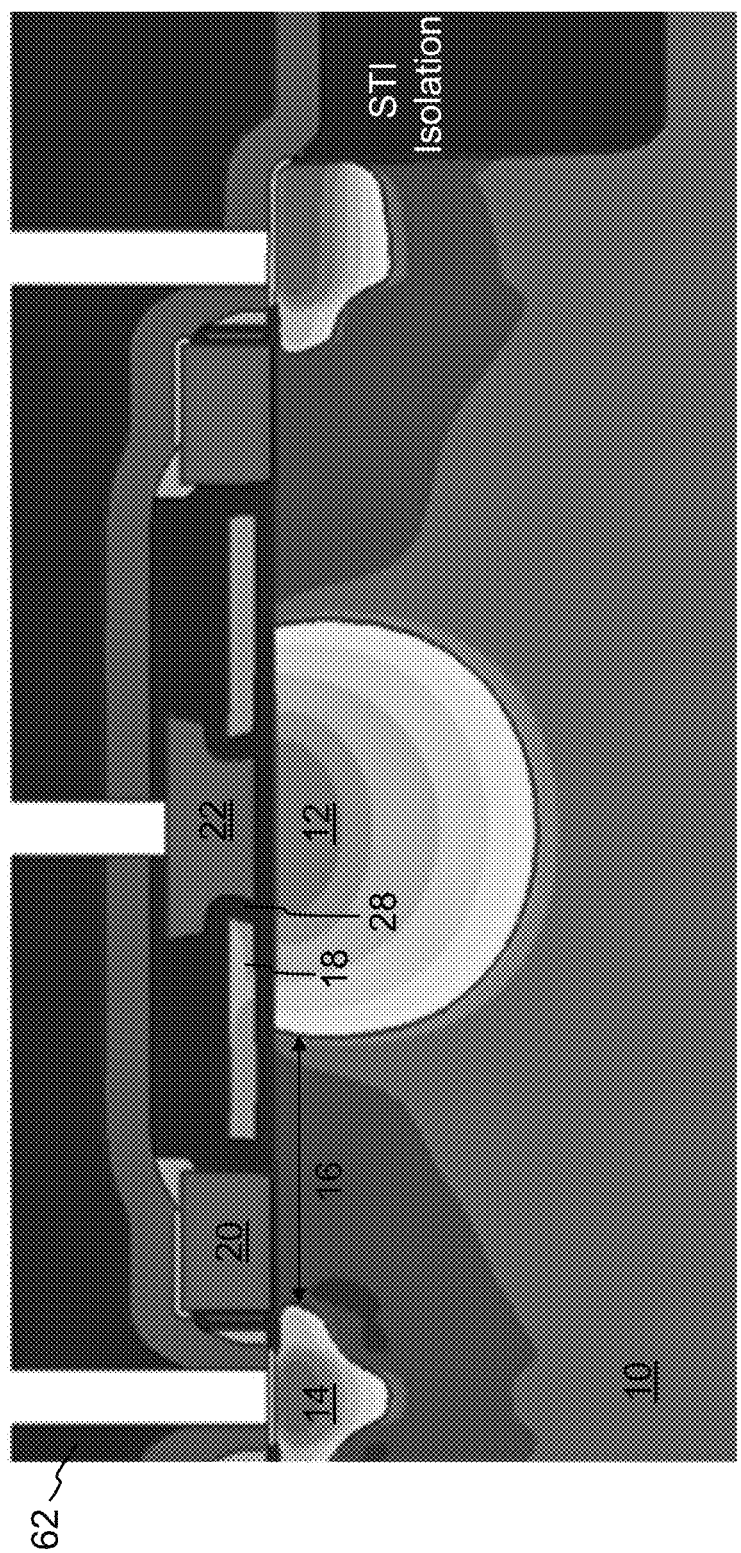

Nitride 46 is removed, and an oxide etch is used to expose outer portions of poly layer 42, which are removed by poly etch to define the outer edges of floating gates 18. The outer edges of floating gates 18 are covered with oxide, as shown in FIG. 9C. An oxide etch removes the oxide layer on the substrate, and a thin layer of oxide 52 is formed on the substrate adjacent the outer edges of the floating gates 18. Oxide layer 52 can be much thinner than the tunnel oxide layer 28. A layer of nitride oxide (SiON) can be formed instead of oxide layer 52 or additionally on oxide layer 52. The memory cell portion is covered with a poly layer 54, and an oxide layer 56 on the poly layer 54, while the logic portion of the device includes SiN (silicon nitride) 58 embedded in the poly layer 54, with that portion of the poly layer 54 under the SiN 58 serving as a logic gate poly and that portion above serving as a dummy poly, as shown in FIG. 9D. Poly etching is then used leaving word line WL poly gates 20 and logic device poly gate 60, as shown in FIG. 9E. Processing continues, including an implantation which forms drain regions 14, and protective oxide 62, as shown in FIG. 9F.

Figure 10:
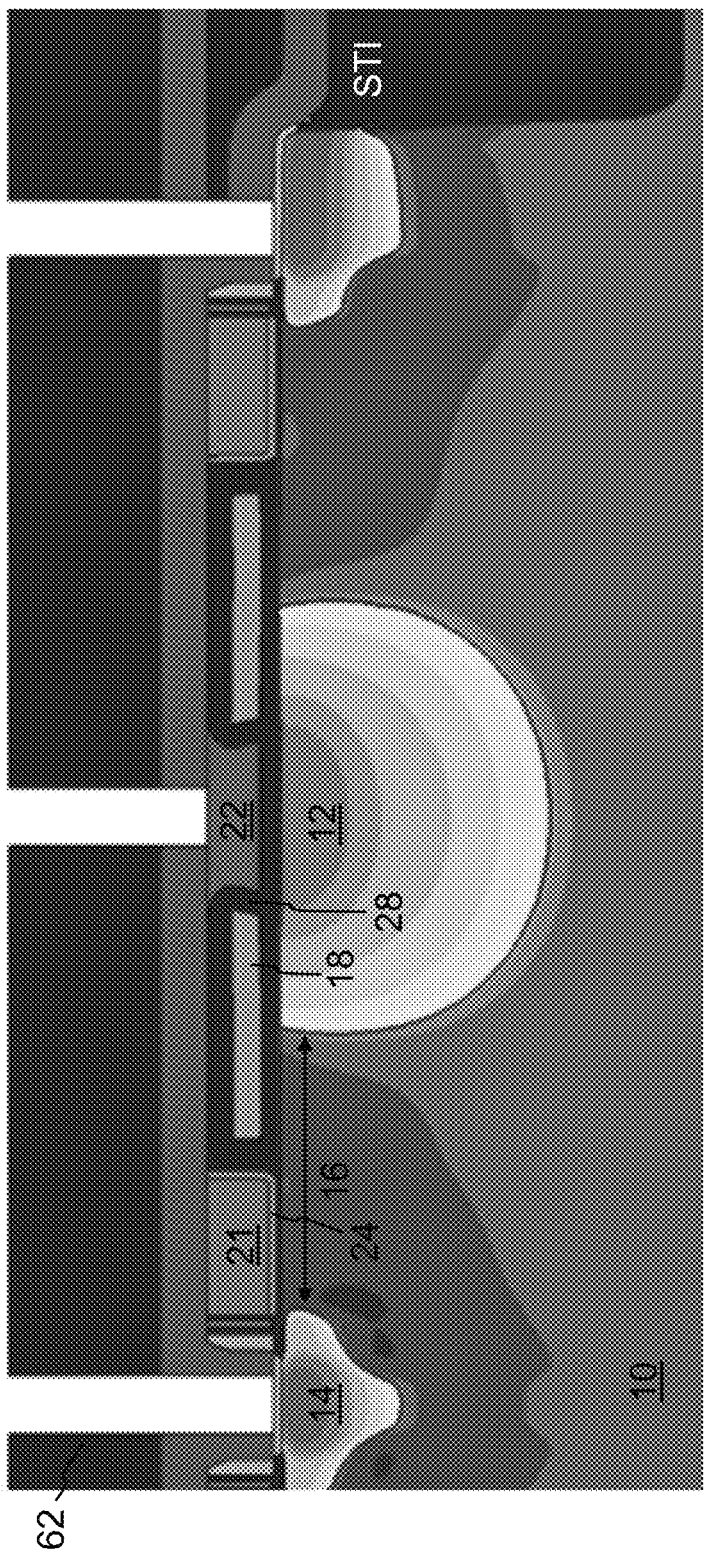
FIG. 10 is a side cross sectional view illustrating an alternate embodiment of the non-volatile memory cell.

In an alternate embodiment, a poly etch can be used to remove the poly word line gates 20, and replace them with metal word line gates 21 surrounded by a high K dielectric 24 on at least two sides, as shown in FIG. 10.

With either embodiment, the total cell height, i.e. erase gate 22 and WL gate 20 height, can be adjusted to meet the logic gate height requirement. The floating gate width, floating gate length and source line are defined by self-aligned process. Process, strap layout and layout of metal connection will be simpler compared to 4-gate devices because the control gate is eliminated. Metal connection will be easier to fill in small Y-pitch advanced device technologies. Fewer photolithography masking steps are needed compared to the conventional 2 and 4 gate devices discussed above. The cell height can be significantly reduced, given the thin oxide layer 52 relative to the tunnel oxide 28 (because the erase gate 22 is being used to high voltage erasing, and the word line gate is only being used as a select gate), the planar upper surfaces of the word line gates 20 and erase gates 22, and that the word line gate 20 need not be formed with any vertical overlap with the floating gate 18.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A memory device, comprising:
   a silicon semiconductor substrate;
   spaced apart source and drain regions formed in the silicon semiconductor substrate with a channel region there between;
   a conductive floating gate disposed over and insulated from a first portion of the channel region and a first portion of the source region;
   a conductive erase gate that includes:
      a first portion that is laterally adjacent to and insulated from the floating gate, and is over and insulated from the source region, and
      a second portion that extends up and over, and is insulated from, the floating gate;
   a conductive word line gate disposed over and insulated from a second portion of the channel region, wherein the word line gate is disposed laterally adjacent to the floating gate and includes no portion disposed over the floating gate;
   wherein a thickness of insulation separating the word line gate from the second portion of the channel region is less than a thickness of insulation separating the floating gate from the erase gate, and wherein the erase gate second portion is the only conductive gate or conductive gate portion disposed over the floating gate.

2. The memory device of claim 1, wherein the word line gate comprises:
   a bottom surface facing the second portion of the channel region, wherein the bottom surface is planar; and
   a top surface opposite the bottom surface, wherein the top surface is planar.

3. The memory device of claim 2, wherein the erase gate comprises:
   a bottom surface facing the source region; and
   a top surface opposite the bottom surface that is planar.

4. The memory device of claim 1, wherein the word line gate comprises:
   metal material; and
   a layer of high K dielectric material disposed between the metal material and the second portion of the channel region.

5. The memory device of claim 1, wherein the word line gate comprises:
   polysilicon; and
   a layer of nitride oxide disposed between the polysilicon and the second portion of the channel region.

* * * * *